(12) United States Patent
Sebastian

(10) Patent No.: US 6,253,264 B1
(45) Date of Patent: *Jun. 26, 2001

(54) CODING NETWORK GROUPING DATA OF SAME DATA TYPE INTO BLOCKS USING FILE DATA STRUCTURE AND SELECTING COMPRESSION FOR INDIVIDUAL BLOCK BASE ON BLOCK DATA TYPE

(75) Inventor: William Sebastian, Falmouth, MA (US)

(73) Assignee: Intelligent Compression Technologies, Falmouth, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/036,052

(22) Filed: Mar. 6, 1998

Related U.S. Application Data

(60) Provisional application No. 60/036,548, filed on Mar. 7, 1997.

(51) Int. Cl.[7] .............................. G06F 17/30; G06F 3/00; G06F 5/00; H03M 7/00; H03M 7/30
(52) U.S. Cl. ................................ 710/68; 710/65; 341/51; 341/107
(58) Field of Search ................................ 341/51, 65, 107; 707/102, 503, 504, 505, 508; 370/474; 710/65, 68

(56) References Cited

U.S. PATENT DOCUMENTS

| | | | |
|---|---|---|---|
| 5,293,379 | * | 3/1994 | Carr ..................................... 370/94.1 |
| 5,467,087 | | 11/1995 | Chu ........................................ 341/51 |
| 5,617,541 | * | 4/1997 | Albanese et al. ................ 395/200.13 |
| 5,632,009 | * | 5/1997 | Rao et al. ............................ 395/770 |
| 5,638,498 | * | 6/1997 | Tyler et al. ........................... 395/117 |
| 5,684,478 | * | 11/1997 | Panaoussis .............................. 341/51 |
| 5,708,828 | * | 1/1998 | Coleman ................................ 395/785 |
| 5,710,562 | * | 1/1998 | Gormish et al. ...................... 341/107 |
| 5,838,964 | * | 11/1998 | Gubser .................................. 395/612 |
| 5,864,860 | * | 1/1999 | Holmes ................................. 707/101 |
| 5,867,114 | * | 2/1999 | Barbir .................................. 341/107 |
| 5,881,380 | * | 3/1999 | Mochizuki et al. ................. 707/102 |
| 5,983,236 | * | 11/1999 | Yager et al. .......................... 707/104 |
| 5,991,515 | * | 11/1999 | Fall et al. ............................. 395/114 |

FOREIGN PATENT DOCUMENTS 0 729 237 A2    8/1996 (EP) .

OTHER PUBLICATIONS

Rice, R.F., et al., "VLSI Universal Noiseless Coder," *NTIS Tech Notes 2301*, p. 234 (Mar. 1,1990).

Diner, D.B., et al., "Competitive Parallel Processing for Compression of Data," *NTIS Tech Notes 2301*, p. 379 (May 1, 1990).

\* cited by examiner

*Primary Examiner*—Thomas Lee
*Assistant Examiner*—Tanh Nguyen
(74) *Attorney, Agent, or Firm*—Hamilton, Brook, Smith & Reynolds, P.C.

(57) ABSTRACT

A preferred coding network uses an architecture called a Base-Filter-Resource (BFR) system. This approach integrates the advantages of format-specific compression into a general-purpose compression tool serving a wide range of data formats. Source data is parsed into blocks of similar data and each parsed blocks are compressed using a respectively selected compression algorithm. The algorithm can be chosen from a static model of the data or can be adaptive to the data in the parsed block. The parsed blocks are then combined into an encoded data file. For decoding, the process is reversed.

29 Claims, 8 Drawing Sheets

CODING NETWORK GROUPING DATA OF SAME DATA TYPE INTO BLOCKS USING FILE DATA STRUCTURE AND SELECTING COMPRESSION FOR INDIVIDUAL BLOCK BASE ON BLOCK DATA TYPE

RELATED APPLICATIONS

This application claims the benefit of U.S. Provisional Serial No. 60/036,548 filed Mar. 7, 1997, the teachings of which are incorporated herein by reference in their entirety.

BACKGROUND OF THE INVENTION

High performance data compression systems use models of the data to increase their ability to predict values, which in turn leads to greater compression. The best models can be achieved by building a compression system to support a specific data format. Instead of trying to deduce a crude model from the data within a specific file, a format-specific compression system can provide a precise pre-determined model. The model can take advantage not just of the file format structure, but also of statistical data gathered from sample databases.

Previous efforts at format-specific compression have been focused on solutions to a few individual formats rather than on the development of a generalized method that could be adapted to many formats. The models which have been created typically involve a small number of components. This works adequately when most of the data is included in a few components, such as an image file having mostly red, blue, and green pixel values. But may formats are best modeled using a large number of components, and the previous systems are not designed to build or encode such models.

SUMMARY OF THE INVENTION

A preferred coding system in accordance with the invention solves both of these problems in the prior art: it provides a generalized solution which can be adapted to handle a wide range of formats, and it effectively handles models that use large numbers of components. The system involves new approaches at many levels: from the highest (interface) level to the lowest (core encoding algorithms) level. The coding network includes a compression network for encoding data and a decompression network for decoding data.

At the highest level, a preferred compression system in accordance with the invention uses an architecture called a Base-Filter-Resource (BFR) system. This approach integrates the advantages of format-specific compression into a general-purpose compression tool serving a wide range of data formats. The system includes filters which each support a specific data format, such as for Excel XLS worksheets or Word DOC files. The base includes the system control modules and a library used by all the filters. The resources include routines which are used by more than one filter, but which are not part of the base. If a filter is installed which matches the format of the data to be encoded, the advantages of format-specific compression can be realized for that data. Otherwise, a "generic" filter is used which achieves performance similar to other non-specific data compression systems (such as PKZip, Stacker, etc.).

At the next level, the system preferably includes a method for parsing source data into individual components. The basic approach, called "structure flipping," provides a key to converting format information into compression models. Structure flipping reorganizes the information in a file so that similar components that are normally separated are grouped together.

Upon this foundation are a numbers of tools, such as:

a language to simplify the creation of parsing routines;

tools to parse the source data using this method into separate components; and tools to generate models for individual components by automated analysis of sample data bases.

These tools can be applied to the filters for a wide range of file and data types.

The compression system preferably includes tools called customized array transforms for specific filters and for certain types of filters. These techniques handle a specific file type or certain data constructions used by several file types, such as encoding two dimensional arrays of data as found in many database formats.

At the low-level of the system are preferably a number of mechanisms for encoding data arrays, including:

new low-level encoding algorithms;

methods for integrating a large number of transforms and encoding algorithms;

methods for eliminating overhead so that small data blocks can be efficiently coded; and a new method for integrating both static models (determined from statistical analysis of sample databases) and dynamic models (adapted to the data within a particular array) into the encoding of each component.

A preferred method of encoding source data comprising parsing the source data into a plurality of blocks. The parsed blocks typically have a different format than the source data format. In particular, similar data from the source data are collected and grouped into respective blocks.

For each block, a compression algorithm is selected from a plurality of candidate compression algorithms and applied to the block. The compression algorithms can be determined based on the amount of data in the respective block. Furthermore, the compression algorithm can be adapted to the respective block, including the use of a customized transform. The selection of an algorithm can also be based on a compression model, which is derived from the format of the source data. The compressed data from the plurality of blocks are then combined into encoded data.

The coding network can also include a decompression network to convert the encoded data back into the source data. First the data is decoded and then the parsing is reversed. In a lossless system, the resulting data is identical to the source data.

Embodiments of the invention preferably take the form of machine executable instructions embedded in a machine-readable format on a CD-ROM, floppy disk or hard disk, or another machine-readable distribution medium. These instructions are executed by one or more processing units to implement the compression and decompression networks.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTIONS OF PREFERRED EMBODIMENTS OF THE INVENTION

Figure 1:
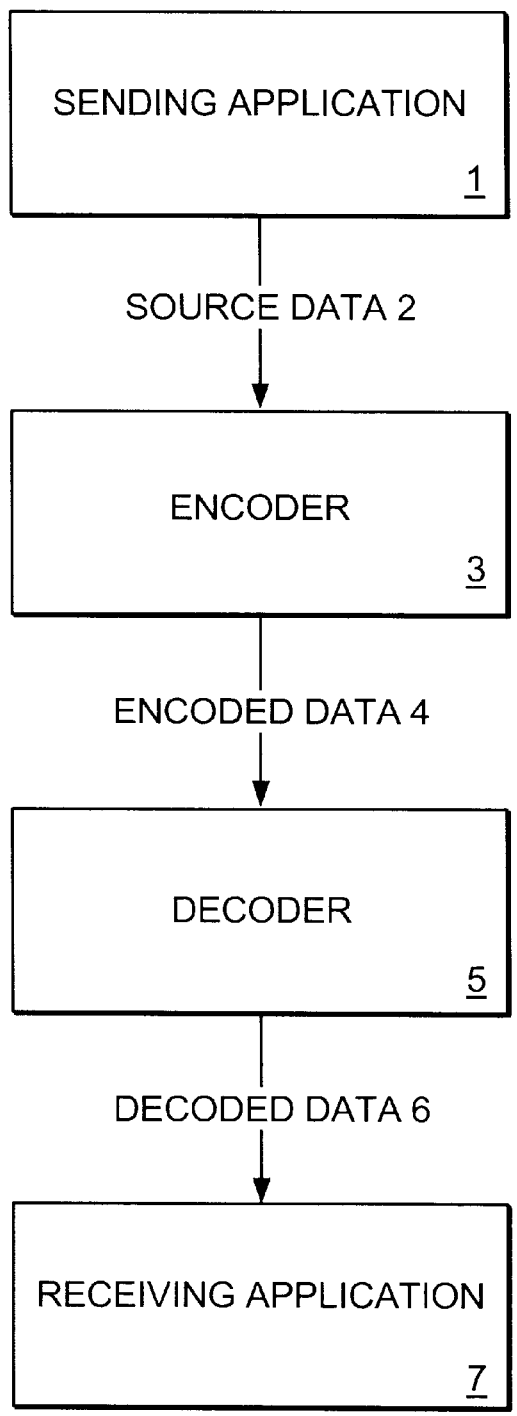
FIG. 1 is a high-level block diagram of a typical data compression system.

FIG. 1 is a high-level block diagram of a typical data compression system. The primary components of the system are a sending application 1, an encoder 3, a decoder 5, and a receiving application 7.

The sending application 1 provides source data 2 to be encoded by the encoder 3. The sending application can be a file archiver, a communication system, or any other application with a need to represent data using fewer bytes than in the native format.

The encoder 3 receives the source data 2 and uses data compression algorithms to represent the data using fewer bytes. The typical implementation of the encoder 3 is as software running on a general purpose computer, although the algorithms to be described may also be implemented on specialized hardware.

The output of the encoder is encoded data 4, which can be stored in memory (in which case the encoding allows more source data to be stored within the same hardware), or transmitted to the decoder 5 (in which case the encoding the source data to be transmitted faster when the transmission channel bandwidth is limited).

The decoder 5 retrieves or receives the encoded data 4 and reverses the algorithms used to encode the data so as to reconstruct the source data as decoded data 6. In a lossless system, the decoded data 6 is identical to the source data. Depending on the application, however, some data loss may be acceptable. As with the encoder 3, the decoder 5 is typically embodied as software running on a general purpose computer, but can be implemented in specialized hardware.

The receiving application 7 receives the decoded data 6 for processing.

A preferred compression engine includes filter-based encoders and decoders which can be utilized by a large number of sending applications 1 and receiving applications 7. While the applications 1,7 that store/retrieve or transmit/receive the encoded data are not part of the compression system, they may adjust encoding and decoding operations according to system conditions such as available transmission channel bandwidth.

The descriptions to follow will mostly cover the encoder. The decoder just reverses the encoder's actions, so a description of the encoder is sufficient to describe the overall encoding/decoding system. The term "File" will be used to describe a block of source data, which matches the conventional usage, but which should also be understood to be applicable to many other types of data blocks such as a data exchange in a Client-Server application.

ENCODER

Figure 2:
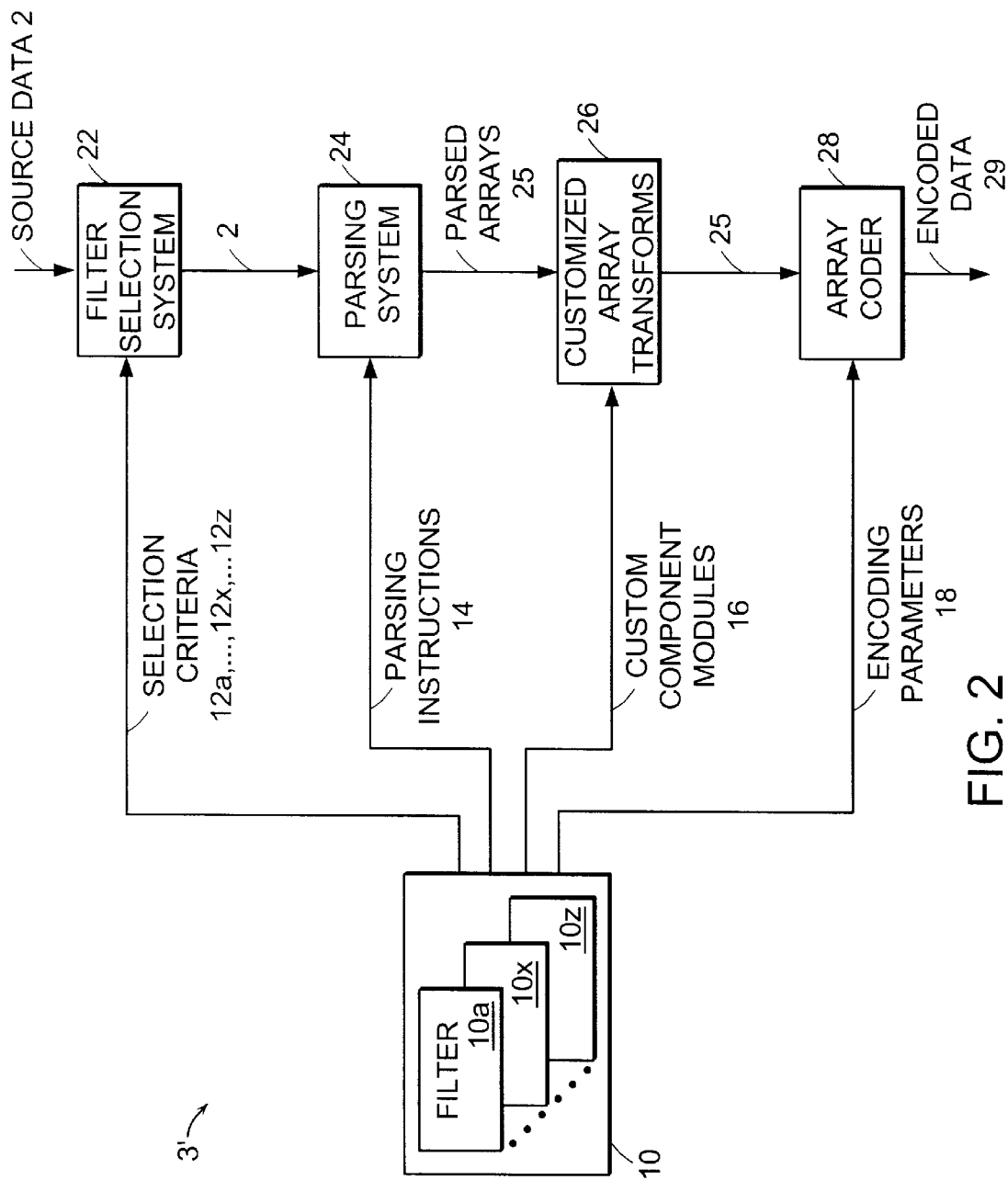
FIG. 2 is a block diagram of a preferred encoder using the BFR system in accordance with the invention.

FIG. 2 is a block diagram of a preferred encoder using a Base-Filter-Resource (BFR) network in accordance with the invention. The encoder 3' is based on the use of a plurality of filters $10a, \ldots, 10x, \ldots, 10z$ which serve specific file formats. For example, one filter $10a$ might support several versions of the DBF database format, while another filter $10z$ might support several versions of the DOC format used by the Microsoft Word software program. The individual filters provide respective selection criteria 12 to a filter selection system 22.

The filter selection system 22 receives the source data 2 and checks the selection criteria $12a, \ldots, 12x, \ldots, 12z$ of all filters $10a, \ldots, 10x, \ldots, 10z$ installed in the system to see if any of them support the source data's format. If not, a "generic" filter is used which provides compression performance similar to other generic compression systems, such as Lempel-Ziv (LZ) engines. In a particular preferred embodiment of the invention, the generic compression system employs an SZIP engine as described by Mr. Schindler in U.S. application Ser. No. 08/970,220 filed Nov. 14, 1997, the teachings of which are incorporated herein by reference in their entirety. The descriptions of the network will primarily cover the situations in which a filter to support the data format is successfully found.

Briefly, a parsing system 24 parses the source data 2 into a large number of parsed Arrays 25, which each include all the instances of a particular component in the source file. The term "Array", described in further detail below, is capitalized to indicate that this refers to a type of structure specific to the network, as opposed to the usual use of the term "array". The algorithm used to parse the source data 2 is called "Structure Flipping", an important aspect of the network, described in further detail below.

The BFR system uses an automated analysis system (also described in detail below) to build a model for each Array 25, which will be used when the Arrays 25 are encoded in an array coder 28. In some cases, better compression can be achieved if customized array transforms 26 are first used. While the models generated by the automated analysis system process each component Array 25 independently, the customized routines can take advantage of inter-component relationships.

The array coder 28 encodes the Arrays 25 using a count-dependent modeling system, which includes a mixture of static models (constant for all databases) and dynamic adjustment to each particular Array 25.

The filter $10x$ has components to support each of the four sections of the encoder 3'. The selection criteria $12x$, determined by the file format specification, includes information needed to recognize files served by the filter $10x$ such as byte values at the beginning of the file or file title suffices. Parsing instructions 14, also determined by the file format specification, include the information needed to parse the source file into parsed Arrays 25 having all the instances of a particular component in the source file. The custom component models 16 are constructed by referencing both the file format specification and sample databases. They can take advantage of inter-component relationships to transform some of the component Arrays 25 to make them more compressible. Encoding parameters 18 are generated by an automated analysis system which examines component Arrays 25 parsed from a large number of sample databases. The encoding parameters 18 provide the data necessary to support the count-dependent modeling system in the array coder 28.

FILTER SELECTION SYSTEM

A preferred compression system uses an expandable architecture that allows users to support new or updated formats by adding or replacing filters 10. As noted above, a filter 10 can support more than one format. For example, a filter called "LOTUS123v4" might support all file formats associated with the Lotus 123 program, such as the current WK4 format and the earlier WK3 and FM3 formats. If a Filter was later developed for a new Lotus WK5 format, a user replaces the old filter with one supporting the new format and which would also be backwardly compatible with the earlier filter with respect to the older formats.

In the Microsoft Windows environment, each Filter is a separate dynamically linked library (DLL) file. In addition to data tables, a filter includes executable code.

If a filter is found for a file, then it is dynamically linked and then called to encode the file. The encoded data stream includes an identification (ID) code indicating which filter was used to encode the data, and the decoder has to have a corresponding decoding filter.

To implement the filter selection system 22, the base module maintains a registry of the currently installed files, which includes the data need to identify source files of that type as well as the path to the DLL. This registry is updated each time a filter is added or replaced. The identification data can include both a list of file title suffices and a method to identify files via byte values near the beginning of the file. The identification procedure uses a search tree method to reduce the time needed to check the list when many filters are installed. From this registry, the appropriate filter 10 is invoked for the file type.

To handle compound file formats such as Microsoft's OLE2, one filter can invoke another filter to encode a sub-file or stream within the compound file. For example, a Winword Filter might call an Excel Filter to encode some Excel data which was embedded within a compound document file.

PARSING SYSTEM

As noted above, the parsing system 24 creates a large number of parsed Arrays 25. Each parsed Array 25 includes all instances of a particular component in a file. A separate component is created for each member of each defined structure type.

EXAMPLE 1

For example, consider the following description of a record defined in a file format description.

Cell Value:

The format uses a special method of coding numbers in an internal number type, called an RK number, to save memory and disk space.

Record Data:

| Offset | Name | Size | Contents |
|--------|------|------|----------|
| 4 | rw | 2 | Row number |
| 6 | col | 2 | Column number |
| 8 | fmt | 2 | Index to the record that includes the cell format |
| 10 | num | 4 | the coded number |

The parsing system 24 creates parsed Arrays 25 for each of the four components of this record. Each time an RK record is found, an entry is added to each array. The parsed Arrays 25 are much more compressible than the raw source data, as shown by data from five records:

| Rec | Row | Col | Index | Num Val |
|-----|-----|-----|-------|---------|
| 1 | 0x0001 | 0x0002 | 0x0055 | 0x3ff1e100 |
| 2 | 0x0001 | 0x0003 | 0x005f | 0x3ff1a300 |
| 3 | 0x0001 | 0x0004 | 0x0053 | 0x3ff1d000 |
| 4 | 0x0001 | 0x0006 | 0x005f | 0x3ff1c400 |
| 5 | 0x0001 | 0x0007 | 0x005f | 0x3ff1d300 |

The source data would appear almost random to a byte-matching algorithm (shown in hex):

01 00 02 00 55 00 00 e1 fl 3f01 00 03 00 5f 00 00 a3 fl 3f 01 00 04 00 53 00 00 d0 fl 3f 01 00 06 00 5f 00 00 c4 e1 fl 3f 01 00 07 00 5f 00 00 d3 fl 3f

But when handled as four separate Arrays 25 (Row, Col, Index, and Num) using algorithms optimized for each component, the data can compress significantly. This approach is referred to herein as "structure flipping" because of the way it rearranges the data.

To encode together the instances of the same component in a database is a common compression technique, and the file format is often used to identify such components. But in the prior art, this approach has been limited to isolating a few major components of a specific file format, and the file format description used only as a technique of finding these major components. In accordance with preferred embodiments of the invention, a file format is actually converted into a compression model, which is then interfaced into an automated system for analyzing the data and optimizing the coding performance of each component. While this compression model is usually enhanced by the customized array transforms 26, it is still an aspect of the overall system.

The extent to which preferred approaches differ from prior art systems is reflected in the new tools constructed in order to implement it. This approach creates a large number of Arrays 25. Each Array 25 requires a different compression model, and the number of entries in each can change significantly from file to file. In order to work effectively in such a case, preferred embodiments of the invention employ new approaches in how the low-level coding is handled such as the elimination of overhead, count-dependent processing, and the use of a processing network instead of fixed coding algorithms. These techniques, described above, are preferred in order to handle the output of the parsing system 24.

All of these implementation features are integrated at a high level, so that high-level calls can handle all of the operations needed to initialize the system, parse the data, and encode the Arrays.

In accordance with a particular preferred embodiment of the invention, the file parsing system 24 uses three subsystems:

| FILE_BUFFER | Input\Output Interface |
|-------------|------------------------|
| ARRAYS | To store the data for a single component |
| PVSTRUCT | To parse the input into Arrays or to write the decoded Arrays into the Output stream |

A plurality of FILE_BUFFER routines provide a flexible input/output interface using FILE_BUFFER structures, so the same set of parsing routines can be used regardless of the input/output formats. This allows the compression system to be independent of the I/O format. The file parsing system preferably supports two file formats: DOS and OLE2, but this can expanded to other file formats as well as to interfaces to communication ports and other I/O options. For DOS files, the logical stream positions are usually the same as the raw file positions. The OLE2 format requires an extensive layer of code to follow an OLE2 stream within the container file.

A plurality of ARRAY routines provide a system for managing the process of initializing, adding data to, encoding, and freeing arrays of data. Each ARRAY structure includes one array of data and the information needed to manage these processes, such as the number of entries in the Array 25, the size of the buffer currently allocated for the array, and information which will be useful in encoding the array.

In particular, ARRAY_XX structure stores all the data from a component, and includes mechanisms to support fast sequential read/write access to the data, an expandable buffer for the data, and storage of model data. This structure also allows a simple set of tools to handle all allocation, parsing, and coding functions. The _XX nomenclature indicates that slightly different ARRAY structures are defined for different data types, such as different integer word sizes, strings, and floating point types, although many of the processing routines work on all of the variations.

A plurality of PVSTRUCT routines make up an automated system for parsing the file data. During encoding, they read data from the FILE_BUFFER structure and write data into Arrays 25. During decoding, they take data from the Arrays 25 and write it into the FILE_BUFFER structures. These routines can take a high-level description of a file format and handle all the tasks associated with managing the parsing as well as the encoding of the parsed data. Many of the Filters 10 will also include customized parsing routines which call the FILE_BUFFER and ARRAY routines directly instead of using the PVSTRUCT routines. But an aspect of the parsing system 24 is the PVSTRUCT routines, and this discussion will be concerned primarily with their operation.

A PVSTRUCT structure includes all information needed to parse and code a data structure defined in a file format. This usually involves multiple components, so it provides and handles individual Arrays 25 for each component. The term "pvstruct" comes from Predictor Variable Structure, where Predictor refers to the use of statistical data gained from analyzing a large number of sample files to assist in the encoding of the data, and Variable indicates that it supports structures where the component counts can vary at run time for each instance (called "dynamic structures" in some textbooks).

A parsing language is a defined instruction set which provides a concise way to specify the parsing of a PVSTRUCT structure. The instruction set includes support for a wide range of dynamic variation, including where the counts of components are dependent on file counts of other components as well as on external factors. It incorporates other file format data, such as defined values or range restrictions. It also provides a means of exchanging data between the parser and the filter.

The compression system is based on parsing a file so as to place items together that are similar. In the following description of the compression system, examples illustrating some structures which might be found in a typical spreadsheet file format.

EXAMPLE 2

Spreadsheet files typically include a series of records. Each record begins with a 16-bit word indicating the type of record followed by a 16-bit word giving the number of bytes in the body of the record. The file specification then describes the contents of each record. A specification for a TABLE SIZE record might be:

RecType=0x402

Rec Body Size=12

Record Data:

| Offset | Name | Size | Contents |
|--------|------|------|----------|
| 4 | MinRow | 2 | First defined row on the sheet |
| 6 | MaxRow | 2 | Last defined row on the sheet, plus 1 |
| 8 | MinCol | 2 | First defined column on the sheet |
| 10 | MaxCol | 2 | Last defined column on the sheet, plus 1 |
| 12 | (Reserved) | 4 | Reserved |

There can be more than one such record in the data. When there is more than one record, the values of the same component in each record are going to be similar to each other. This enables the compression system to take advantage of the similarities to increase the compression ratio.

The compression system is preferably based on the ARRAY_XX structures, including:

| | |
|---|---|
| ARRAY_U8: | for 8-bit data items, treated by the encoding system as being unsigned |
| ARRAY_16: | for 16-bit data items, treated by the encoding system as being signed |
| ARRAY_32: | for 32-bit data items, treated by the encoding system as being signed |
| ARRAY_F32: | for 32-bit floats |
| ARRAY_F64 | for 64-bit floats ("doubles") |
| ARRAY_F80: | for 80-bit floats ("long doubles") |
| ARRAY_STR: | each entry includes several bytes whose count is given by a size (string size). |

For the TABLE SIZE record, five arrays would be created (referring to the record specification). Each time a record is parsed, an entry is added into each of the five arrays.

When all the records had been parsed, a function is invoked to encode the items in each array. This function includes a large number of algorithms, which can exploit a wide variety of relationships to achieve maximum compression. The implementation is extremely efficient in that it requires virtually no overhead: an array with only one entry can even be efficiently compressed. This is necessary because the parsing system can transform a file into a huge number of these small arrays. The encoding function can also free the data after it finishes encoding it.

The decoding process reverses the sequence. First, each of the component arrays is decoded. Then the parsing is reversed.

As this type of parsing has to be done extensively, a number of tools are used to simplify the process. They are based on the use of instructions called vstruct_defs. To continue with the TABLE SIZE example, the instruction set to parse such a record would be:

```
// the first 3 instructions always provide general info about the record:
8,          // num instructions in this set
12,         // size of the record body, which is a fixed sz of 12 bytes
5,          // num arrays to be created
// the remaining instructions tell how to parse the record:
INT16,      // Parse a 16 bit integer for the first component ("MinRow")
INT16,
```

-continued

```
INT16,
INT16,
INT32 };   // Parse a 32 bit integer for the last component ("Reserved")
```

The vstruct_def instructions are 16 bit integers. The first three words always include the same general info about the record. The rest of the words include instructions which tell the automated parsing system how to proceed when encountering such a record. In this case, the instructions are the simplest possible—just a list of data types for each component of the record. The parser would create an array for each component, and load one entry of that type into the array each time it parses a record of that type:

Functions are then provided to automate the parsing and encoding of records based on these instructions. Again, the decoding process reverses the actions of the encoder.

The vstruct_def instructions can handle situations much more complex than the previous example. For convenience, a summary of the construction of these instructions will be summarized next. The upper byte of the 16 bit instruction is an argument as required by the lower byte. The lower byte is divided into two 4-bit codes. The lowest 4 bits describe the type of instruction and determine the meaning of the next 4 bits. This bitfield structure makes the instructions very readable in hexadecimal notation, which is used in the following description of the codes. The character 'x' represents hexadecimal values that do not affect the code word being described:

Bits 0=3 set the Instruction type (opcode)

If opcode <=b, this value gives the component's data type. The upper fields are then used as follows:

Bits 8–15 are the arguments (ARG) when used.

Bits 4–7 are used as:

```
xx0x:  simple entry. Read one data item of this type
xx1x:  add ARG entries of that type into a single array
xx2x:  also adds multiple items into the same array, but the
       count is given in DataBuf [ARG]
xx8x:  Value item is defined in spec. Value is read &
       checked, but does not need to be stored.
xxfx:  value range is restricted to less than the range allowed
       by the data type. ARG selects a defined range or a
       defined list
If opcode = xxxd:  Start sub-structure
If opcode = xxxe:  Start sub-sub-structure
If opcode = xxxf:  Special instruct, type determined by Bits 4–7:
                   xx0x:  end sub structure
                   xx1x:  end sub-sub structure
                   xx2x:  add value to DataBuf (position given by
                          ARG)
                   xx5x:  stores the number of words of size ARG
                          remaining in the externally-supplied
                          record length
```

The data types selected by the opcode are defined as:

```
#define CHAR      0
#define UCHAR     0
#define INT16     1
#define UINT16    1
#define INT32     2
#define UINT32    2
#define FLOAT32   3
#define FLOAT64   4
#define FLOAT80   5
#define STRING    6
#define STRINGZ   7
#define SYS_S1    8
#define SYS_SZ1   9
#define SYS_S2    0xa
#define SYS_SZ2   0xb
```

In the encoder, no distinction is made between signed and unsigned integers. 8-bit values are always processed as unsigned; 16 and 32-bit values as signed. This convention is used to simplify and speed up the routines, such as to have fewer cases to check in a switch statement. It has little impact on compression performance, but where the file data is also used in parsing (such as when element counts are part of the file data), care should be exercised.

The STRINGZ refers to zero terminated strings. They are stored in the same ARRAY_STR as normal strings, but can be handled differently during parsing. For example, the string length needs to be provided when parsing a regular string, but a STRINGZ can find its own length. The STRINGZ also does not need to store the zero terminating char.

The SYS_Sxx types refer to system strings. Normally, each component of each pvstruct is self contained, in that each is placed into a separate array and coded independently. Having many small but highly correlated arrays is very efficient for numerical data when using the encode routines. But for strings, the compression can often be improved by placing many component strings into a single array, such as to combine text data from multiple records. The system allows for two "System" strings to hold these combined components. The strings added into these system data may be regular or STRINGZ types.

To illustrate, two simple examples are described below.

EXAMPLE 3

In this example, water depth at a particular location is measured 8 different times and stored in a database:

Record Components int16 locationX;

int16 locationY;

int16 depth[8];

The depth measurements would be very similar, so one would want to place them into a single Array. The instruction set would be:

```
vstruct_def VD_ex2[ ] = {
        6,        // 6 instruction words
        20,       // 20 bytes per record
        3,        // num arrays to be created
        INT16,
        INT16,
        0x811);   // 8 int16 entries into single array
        where the 0x811:
                xxx1:  data type is INT16
                xx1x:  num instances for this component in each
                       record is given by the ARG
                08xx:  ARG = 8
```

EXAMPLE 4

In this example, a record stores the ages for someone's friends:

Record Components
  int16 num_friends;
  uchar ages[num_friends];

An array with a variable size such as this cannot be declared within a structure in the 'C' programming language, but it occurs frequently in file formats. This type of construction is often called a dynamic structure. It can be parsed via the instruction set:

```
vstruct_def VD_ex3[ ] = {
        6,              // 6 instruction words
        INTERN_SZ,      // Size of record determined by internal data
        2,              // num arrays to be created
        INT16,          // the num_friends entry
        0x12f,          // store the previous val in register 1
        0x120);         // U8 vals: ct from register 1
        where the 0x12f:
                xxxf:   special instruction
                xx2x:   store the data value parsed by the previous
                        instruction in the register specified by the
                        ARG
                01xx:   ARG = 1, use register 1
        and the 0x120:
                xxx0:   data type is uchar
                xx2x:   multiple entries, count found in register
                        given in ARG
                01xx:   ARG = 1: use register 1
```

Registers are allocated as part of the PVSTRUCT structure and are used for temporary storage of data while processing a record. Register 0 is used for special purposes (see the following example). The programmer designing a filter can use the rest of the entries arbitrarily. The registers can also be used to exchange data between a pvstruct and the rest of the program. For example, if one item buried in a large record is needed for control purposes, it can be dumped into a register with a xx2f instruction following the instruction that read the data item. The data item will then be available in the register after the call to read or write the file.

EXAMPLE 5

A file specification for a record called COLUMN TYPES might be:

RecType=0x413
Rec Body Size=Variable
Record Data:

| Offset | Name      | Size | Contents                      |
|--------|-----------|------|-------------------------------|
| 4      | AlignCode | 1    | Alignment Code                |
| 5      | Style     | 1    | Column Style Code             |
| 6      | Font      | 2    | Default Font Used for Column  |
| 8      | Offsets   | var  | Column Offsets                |

Offsets are 1 byte values. The number of offsets is determined by the record size The instruction set for this record would be:

```
vstruct_def VD_413[]={
        8,              // 8 instructions
        EXTERN_SZ,      // the size of the record body
                        is set externally
        4,              // num arrays to be created
        UCHAR, UCHAR,
        INT16
        0x15f,          // load num 1byte words left in
                        file: register 0 used by
                        default for this
                        //ENDTO count
        0x020};         // U8 vals: ct from register 0
```

The last component of the record is a list of 1-byte column offsets. These will be similar to each other and should all be placed in a single array. In this case, the number of such entries cannot be determined internally: have to use the record size which would have been previously parsed. The 0x15f instruction tells the parser to determine the number of 1-byte words remaining in the record, and this count is always stored in register 0. The 0x020 tells the parser that multiple 1 byte items are to be added into a single array, and that the number of such items can be found in register 0.

EXAMPLE 6

An example of a record called RANGE DEFINITION including a string might be:

RecType=0x215
Rec Body Size=24
Record Data:

| Offset | Name     | Size | Contents              |
|--------|----------|------|-----------------------|
| 4      | Name     | 16   | Name of Range         |
| 20     | StartRow | 2    | First Row in Range    |
| 22     | EndRow   | 2    | Last Row in Range     |
| 24     | StartCol | 2    | First Column in Range |
| 26     | EndCol   | 2    | Last Column in Range  |

The instruction set for this record is:

```
vstruct_def VD_215[]={
        8,              // 8 instructions
        24,             // fixed sz = 24 bytes
        5,              // num arrays to be created
        0x1018,         // 8=SYS_STR1; sz 16 (0x10)
        INT16,
        INT16,
        INT16,
        INT16};
        where 0x1018:
                xxx8:   indicate that the string will be stored in the
                        SYS_STR1 array.
                xx1x:   length is given by ARG
                10xx:   ARG = 16 (0x10)
```

A subjective decision has been made here by the person writing the filter. The component which was handled as a string could also have been handled as multiple entries as previously shown. Its instruction would have been:

0x1010
where
  xxx0=UCHAR type
  xx1x=fixed count given in arg
  10xx=ARG=16 (0x10 hex)

The decision to use a String Array was based on the nature of the entry. The record includes a text string. The array encoding system provides a number of special features to handle strings. For example, it checks for full string matches (all 16 chars of one entry match another), which can be encoded very efficiently. Consequently, text strings are always compressed more efficiently when stored as Strings. In contrast, the offsets in the previous section would be better handled within the numeric compressor, which does not use string sizes.

EXAMPLE 7

The file specification for another record called EXTERNAL REFERENCES including a string might be:

RecType=0x17A
Rec Body Size=var

Record Data:

| Offset | Name | Size | Contents |
|---|---|---|---|
| 4 | StartRow | 2 | First Row in Range |
| 6 | EndRow | 2 | Last Row in Range |
| 8 | StartCol | 2 | First Column in Range |
| 10 | EndCol | 2 | Last Column in Range |
| 12 | Name | var | Zero-terminated String Containing Range Reference |

The instruction set for this record is:

```
vstruct_def VD_17a[]={
    8,              // 8 instructions
    INTERN_SZ,      // rec body size not fixed, but will be set by
                    internal data
    5,              // num arrays to be created
    INT16,
    INT16,
    INT16,
    INT16,
    SYS_SZ2};
```

The last component of the record is a zero terminated string. The length of the string can be found by searching for the terminating character. As the string array will store and encode the string size, the terminating character does not need to be saved. The INTERN_SZ indicates that the size of the record, while not known in advance, will be determined internally, so that the record size would not need to be encoded, as was needed for the Column Types record of Example 5.

EXAMPLE 8

A structure can be nested within another structure. The parent structure can include multiple instances of the nested structure. A description of such a COLUMN STATUS record might be:

RecType =0x7
Rec Body Size=var

Record Data:

| Offset | Name | Size | Contents |
|---|---|---|---|
| 4 | Default Status | 1 | Default Status for Columns |
| 5 | Col Data | var | The list of ColData entries as defined below |

The ColData entries give the offset to each column whose status doe not equal the default, and the status of that column. Each entry is 2 bytes:

| Offset | 1 byte |
|---|---|
| Status | 1 byte |

The instruction for this record is:

```
vstruct_def VD_7[]={
    8,              // 8 instructions
    EXTERN_SZ,      // variable size needing extern input
    3,              num arrays to be created
    UCHAR,          // the "Default Status" is part of the parent
                    structure
    // ready to start the sub-structure. Count is the number that can fit
    into the remaining space
    // in the externally supplied record body size:
    0x25f,          // load num 2byte words left in file into register
                    0, the defined location
                    // for ENDTO data
    0x02d,          // start sub; ct from register 0
    UCHAR,          // the "Offset" is the first component of the sub-
                    structure
    UCHAR};         // the "Status" is the second component of the
                    sub-structure
```

The last component of the record is a series of offset/status pairs. Separate arrays need to be created for the offset component and for the width component. The parser has to go through the sequence of pairs and place the items into their proper array. This general procedure is handled by sub-structures. In this case, the sub-structure has two uchar components. Two instructions were involved in setting up the sub-structure.

```
0x25f:  Used to set the count in this case
    xxxf:   the f indicates a special instruction
    xx5x:   determine the number of ARG length units left in the
            record and store it in register 0
    02xx:   The unit size is 2 (2 bytes per sub-structure)
0x02d:  The actual command to start a sub-structure
    xxxd:   Start a substructure
    xx2x:   Num instances of the sub-structure in the record is found
            in the register [ARG]
    00xx:   ARG=0 (so count is at register 0)
```

All subsequent components are treated as elements of the sub-structure until a End_SubStructure instruction is encountered (0x000f). If none is encountered prior to the end of the instruction list, all remaining components are part of the sub-structure. If an End_Substructure command is found, subsequent instructions refer to components to be included as part of the main structure.

Although the parsing system also supports a sub-sub-structure (a sub structure within a sub-structure), higher levels of nesting are preferably not allowed because no file specs so complicated have yet been identified. As many sub-structures or sub-sub-structures can be defined as needed within a pvstruct, preferably as long as the resting goes no deeper than two levels at a time: i.e., return back to the parent nesting level via an End_SubStructure instruction.

EXAMPLE 9

In some case, the range of data to be written into an array is defined by the file format as being less than the full numerical range allowed by the word size. For example, a file specification might specify a one byte entry that is either 0 or 1. This information can be used both by the parsing system as a sanity check and by the encoding system to increase compression. The description of an illustrative COLUMN OPEN record is:

RecType=0x11
Rec Body Size=1
Record Data:

| Offset | Name | Size | Contents |
|---|---|---|---|
| 4 | ColOpen | 1 | Either 0 (column closed) or 1 (column open) |

The instruction set for this record is:

```
vstruct_def VD_11[]={
    4,          // 4 instructions
    1,          // fixed sz = 1 byte
    1,          // num arrays to be created
    D8_1};      // defined constant as a described below
```

Instead of entering UCHAR, D8_1 is entered, a defined code indicating an 8-bit word size and a 1-bit range of values actually used. These range restrictions do not affect the parsing of the file: a range restriction entry is parsed according to its word size. The range restrictions are used to assist the automated generation of the PREDICTOR structure, which includes the static model for a component and controls the encoding of the Arrays. The code words currently defined use the format:

Defined ranges where min_val=0; max_val=(1<<nbits)−1;

DX_Y:
  X=word size (8=uchar;16=int16;32=int32)
  Y=nbits

Defined ranges starting at 1:min_val=1; max_val=(1<<nbits);

$DX_{Ys}1$:
  X=word size (8=uchar;16=int16;32=int32)
  Y-nbits

Specially defined Ranges
DX_rY:
  X=word size (8=uchar;16=int16;32=int32)
  Y=index of RANGE entry in PREDICTOR_CONTROL->spec_range[ ]

Specially defined list of Values:
DX_vY:
  X=word size (8=uchar;16=int16;32=int32)
  Y=index of VALUE_LIST entry in PREDICTOR_CONTROL->spec_dlist[ ]

The parsing system 24 (FIG. 2) is preferably implemented as a function library written in the C programming language. This description of the library is divided into three sections: the FILE I/O routines, the ARRAY routines, and the PVSTRUCT routines.

The parsing system 24 includes a flexible input/output interface, so the same set of parsing routines can be used regardless of the input/output formats. Two file formats are supported: DOS and OLE2, but this can be expanded to other file formats as well as to interfaces to communication ports and other I/O options. The DOS format is trivial, in that the logical stream position is usually the same as the raw file position. The OLE2 format requires an extensive layer of code to reconstruct an OLE2 stream using the internal allocation table.

CUSTOMIZED ARRAY TRANSFORMS

The parsing system 24 creates Arrays 25 for each component in the source file, and the array coder 28, assisted by the encoding parameters 18 generated by the automated analysis system, finds the best way to encode each Array 25 using the algorithms available to it. In some cases, these automated default mechanisms can be improved upon using custom routines. The custom routines are called transforms, because they begin with parsed Arrays 25 and the result is a different set of Arrays 25 sent to the array coder 28.

The primary role of the customized array transforms 26 is to implement inter-component models: when the data from one component can assist in the coding of another component. The automated default mechanisms process each component individually, and the compression performance can sometimes be improved by exploiting inter-component relationships. Such a system is one that can accurately predict all the values in an Array 25, so that no code is required for the Array 25. The customized array transforms 26 becomes a simulator: duplicating the functionality of the program which generated the source data file. Each custom routine is a separate creation solving a specific problem associated with a single Filter 10. Many of these routines could be independently applied as a solution to that particular problem.

Because custom routines require more labor to construct and inflate the size of the executable, their use is preferably restricted to cases which are likely to produce a significant boost in the overall performance. In many file formats, a few of the components make up most of the data. Customized array transforms 26 can usually improve the compression of these frequent components, while the automated default mechanisms achieve adequate compression of the remaining components.

The other parts of the system play a significant role even on components for which customized array transforms 26 are written. The parsing system 24 simplifies the isolation of the components and the identification and analysis of components needing custom work. The array coder 28 and the automated analysis routines still process the Arrays generated by the customized array transforms 26. The capabilities of the array coder 28 allow for innovative approaches to the custom modeling. One such approach is compression via sub-division: transforming an Array 25 into multiple Arrays 25, each of which being internally correlated in a way that can be exploited by the array coder 28.

As an example of this, consider the coded numbers above in Example 1. These values would be parsed into a single Array 25 of 32-bit integers. But these values are not integers but rather are codes in which two of the bits indicate that the entry is one of four different types, and the remaining bits have different meanings for each type. A new Array 25 can be created for the 2-bit flags, and then separate arrays can be created for each of the four types. The automated analysis system and the array coder 28 can find different and optimal models for each of these five Arrays, and the system's efficiency at handling Arrays with fewer entries eliminates the overhead from using the multiple Arrays. As a result, the total codes size resulting from coding these five highly correlated Arrays is significantly less than encoding the single original Array.

If a customized array transform can be used by more than one filter 10, it can be turned into a resource. Resources are separate modules (DLLs in the Windows environment) which are used by more than one filter. The main reasons for using resources is to reduce the redundant code.

ARRAY CODER

Most compression algorithms involve transforming a data block and then encoding the results using a method that represents the most frequent values using fewer bits. Several successive transforms can be used, and each transform may create multiple output blocks. In a typical LZ77 coder, for example, the source data is transformed into four different arrays: a block of 1-bit flags indicating whether a matching sequence was found, an array of bytes which did not match any previous sequence, and the length and position of a matching sequence when one was found. The first three arrays are often combined into a single array and then Huffman coded, while the match positions are range-transformed and then Huffman coded.

This type of compression system can be viewed as a processing network, where the source Array undergoes transforms which convert it into one or more different Arrays which in turn may go through other transforms. At the end of each path is the low-level coder, such as the Huffman coder or arithmetic coder, which converts a probabilistic model into the encoded output. Conventional approaches to data compression are based on "compression algorithms" having a small number of transforms and defining a fixed path through them. These fixed systems handle the encoding needs of conventional parsing systems which generate a small number of components.

A preferred parsing system 24 in accordance with the invention creates large numbers of Arrays 25 representing different components in the different Filters 10. The data type (strings, floating point values and integers of various word sizes) can be different for each component. The data within each of these component Arrays can be internally correlated in many different ways. To achieve optimum compression requires using a compression algorithm which exploits these patterns. The optimum algorithm is also affected by the current availability of memory and the desired trade-off between speed and compression performance. The number of entries in each Array also varies widely, and different coding approaches can work better at different Array counts.

The preferred coder system has available a static model of each component. This model is obtained by analyzing instances of this component in a large number of source files of the type being served by a Filter. The system is neither "static" nor "adaptive", but rather uses information from the static model wherever it is helpful, while being fully able to respond to the unique data set found in each Array. The static model can both guide the selection of transform algorithms and provide pre-computed encoding tables for the various algorithms.

Consequently, the preferred coder system has to support thousands of different ways to encode each Array. The processing system is not a fixed algorithm, but rather a dynamic network and each path through this network creates a different encoding algorithm. The path of the data through the network is guided by both static models and dynamic considerations, such as the number of entries in the Array, the speed and memory constraints.

An aspect of the preferred coder system is the extensive use of the Array counts (the number of entries in an Array) to control the network. At lower counts, the system relies heavily upon a static model, generated from analysis of sample databases. As the count increases, the system uses approaches which adapt more to the characteristics a specific Array, because the gains from using adaptive models begin to outweight the overhead of encoding the adaptive model. The overhead at low counts is almost completely eliminated, so that Arrays with only a single entry can even be encoded efficiently. This elimination of overhead in turn allows new types of approaches to be used which might be called compression by sub-division, wherein source Arrays are transformed into large numbers of highly correlated, smaller Arrays.

The preferred coder system also includes a number of original algorithms which provide increased compression performance for many of the components which have been encountered. Routines such as the floating point and string Array transforms provide significant benefits over previous methods for encoding these components.

Figure 3:
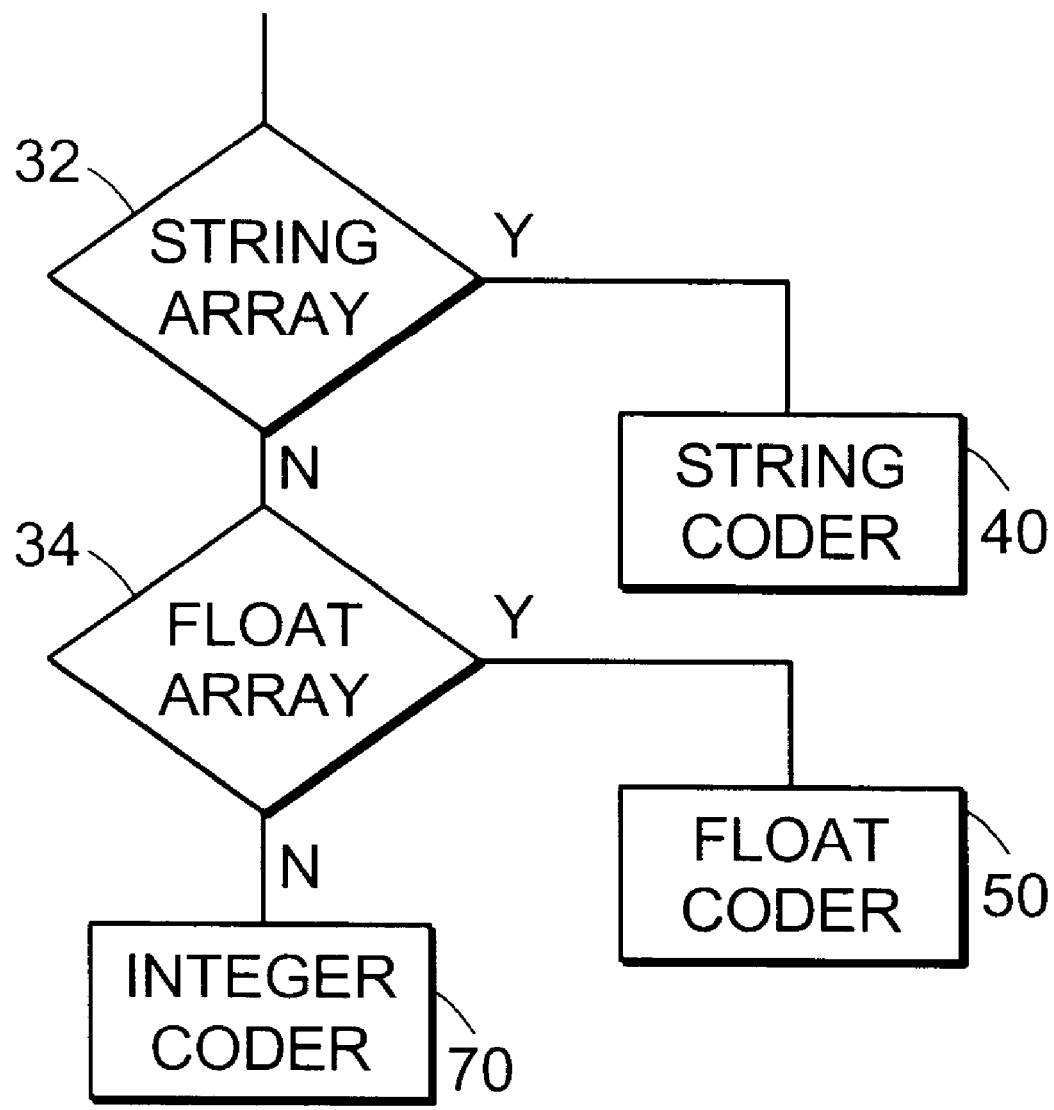
FIG. 3 is a flow chart of an array coder.

FIG. 3 is a flow chart of an array coder. To simplify the interface with other routines, a preferred implementation of the array coder includes a single encoding routine which handles all Array types (integers and floating point values of various word sizes, strings, etc.). The master routine then routes each Array to a specialized encoding routine for that data type as shown.

In particular at step 32, the Array 25 type is checked as a string array. If the Array is a string array, then a string coder 40 is called. If the array is not a string array, the Array type is checked at step 34 as a float type. If the Array is a float type, then a float coder 50 is called. If the Array is neither a string nor a float type, then it is an integer type and an integer coder 70 is called.

Figure 4:
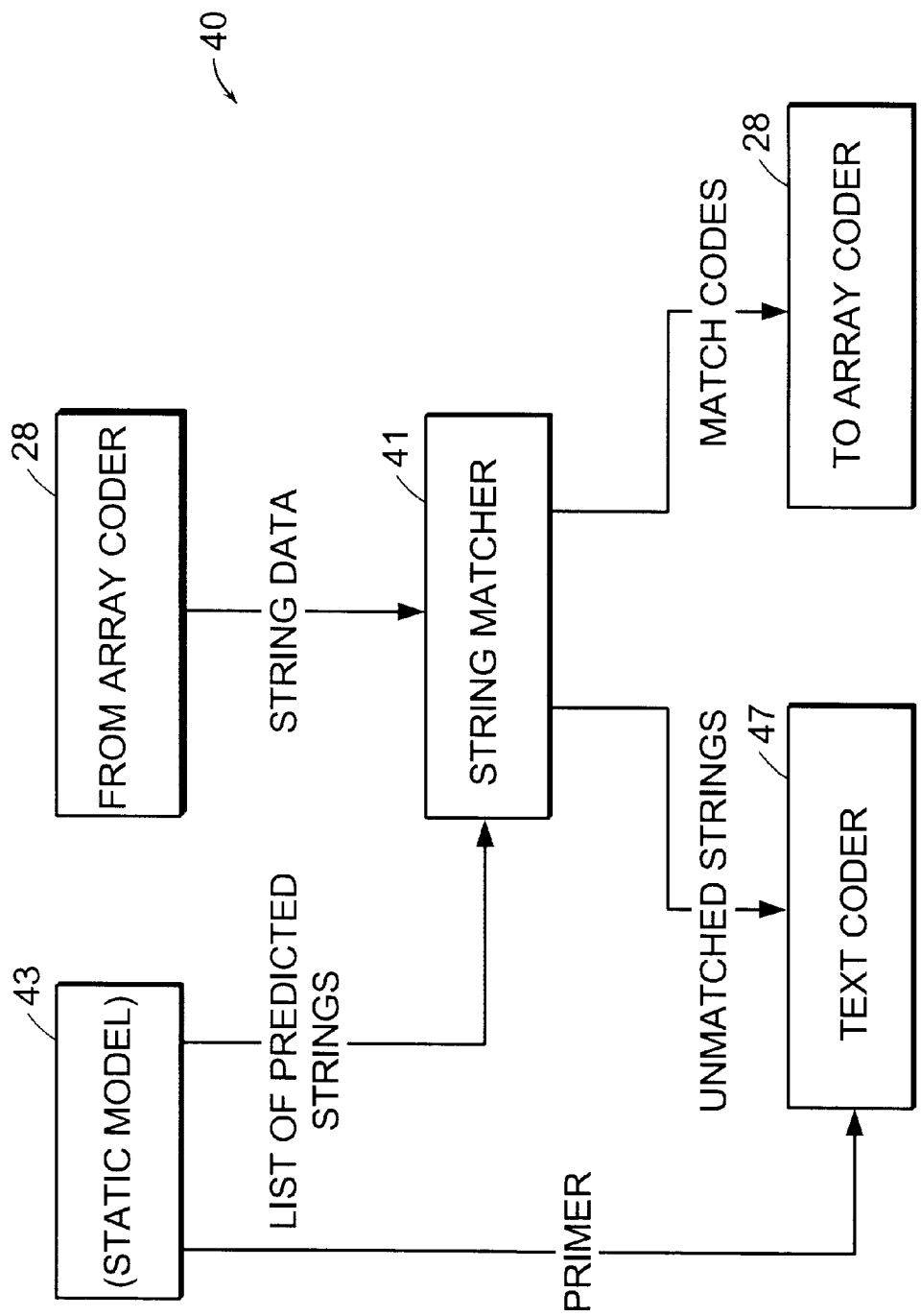
FIG. 4 is a block diagram of the string coder 40 of FIG. 3.

FIG. 4 is a block diagram of the string coder 40 of FIG. 3. The term "String" is used herein to describe a multi-byte sequence of characters. A string Array can include one or more such strings, each of which can have a different string size (the number of bytes in that sequence). The string coder first may check for string matches in received string data using a string matcher 41—cases where an entire string matches all another string in the Array. The string matcher 41 can operate on string data from the array coder 28 or a list of predicted strings supplied by a static model 43. Afterward, the Array may be encoded by several mechanisms. Smaller Arrays such as unmatched strings can be processed by a text coder 47 which uses a variation of the LZ transform, which in turn takes advantage of the string positions and which can also use static models to prime the dictionary or suggest coding tables. Larger arrays of match codes can be serviced by standard text compression routines provided by the array coder 28, such as block sorting algorithms and other well known techniques. If the text coder 47 is used by the static model 43, the coder is primed by the static model 43.

Figure 5:
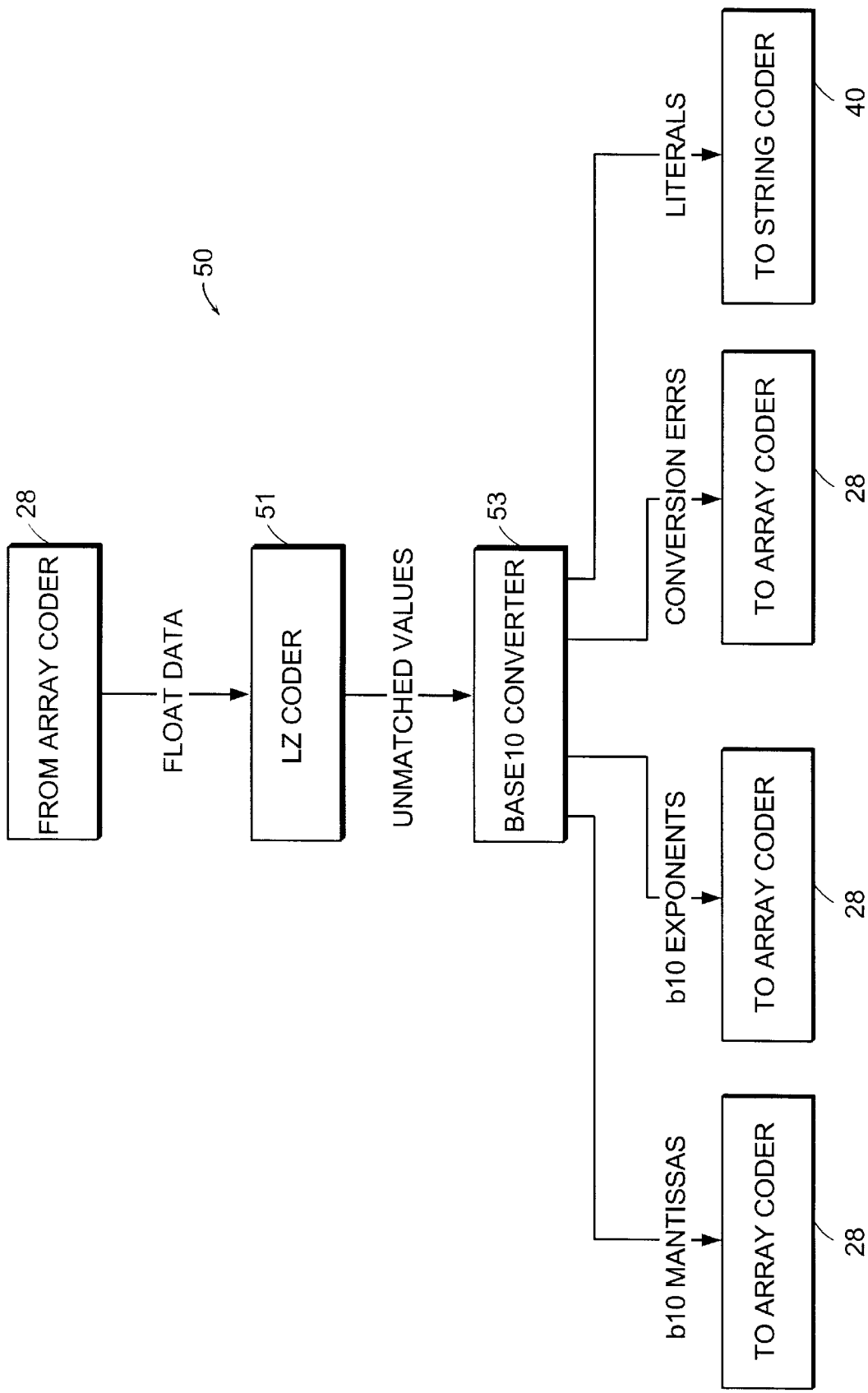
FIG. 5 is a block diagram of the float coder 50 of FIG. 3.

FIG. 5 is a block diagram of the float coder 50 of FIG. 3. Floating point Arrays may be in either 32, 64, or 80 bit formats. The float coder receives float data from the array coder 28 and first checks for matches with previous values using an LZ coder 51, which matches only full-words (such as all 8 bytes of a double-precision floating point value) and returns an Array having the un-matched values. The un-matched values are then be converted to base 10 notation in a base 10 converter 53, as many databases include floating point values which were originally entered as base 10 values, and encoding the values through the array coder 28 in their native format is more efficient. The base 10 mantissas, exponents and conversion errors are processed separately by the array coder 28. For lossless coding an offset may have to be stored to correct slight rounding errors in the conversion. Values which were not effectively converted to base 10 are then encoded using the string coder 40 (FIG. 4).

AUTOMATED ANALYSIS SYSTEMS

The parsing system parses the source files into a large number of components. By examining the same component in a number of sample files, a static model can be built of that component, which can increase compression of Arrays of that component in the Array coder. The automated analysis system finds the best such model.

Figure 6:
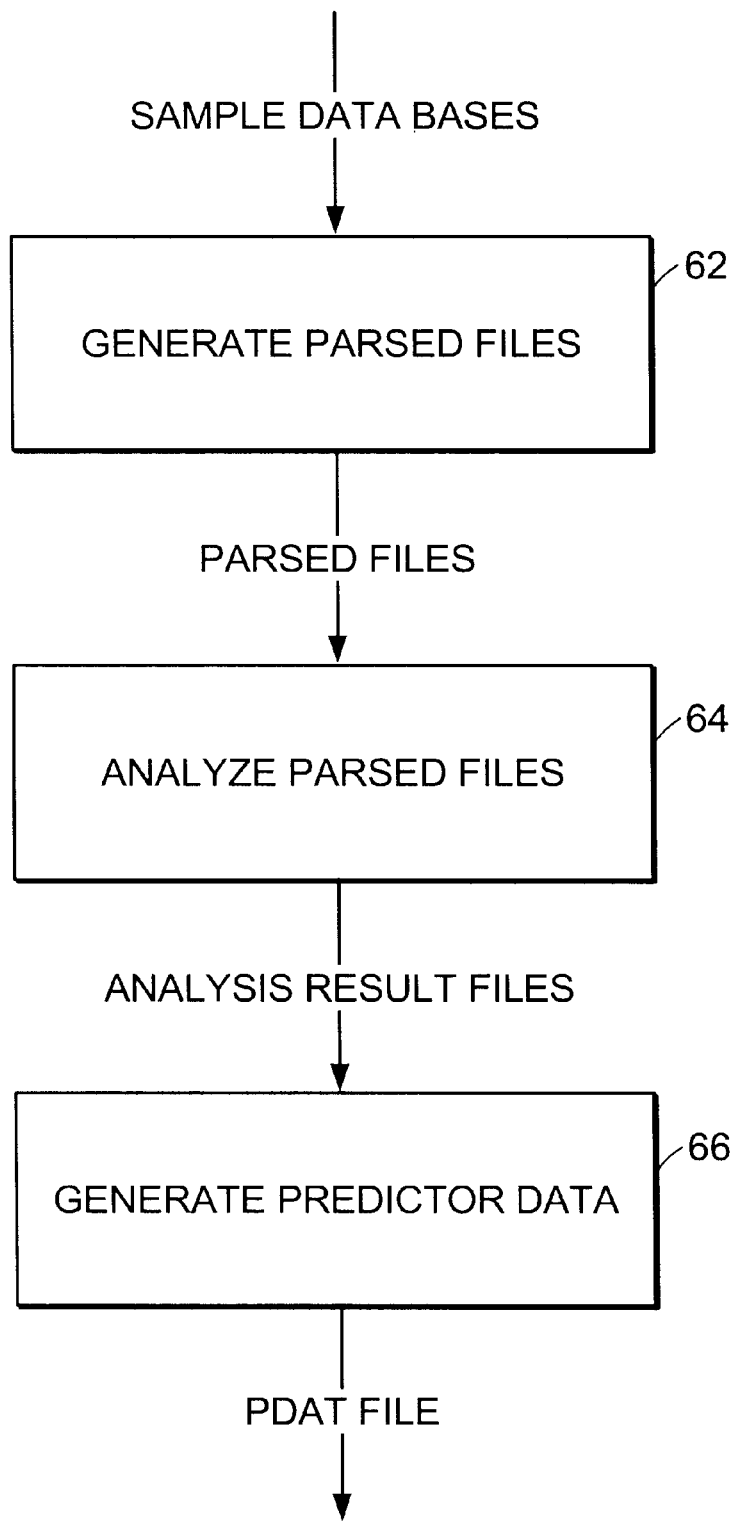
FIG. 6 is a flowchart of a preferred automated analysis system.

FIG. 6 is a flowchart of a preferred automated analysis system. At step 62, the operation is simplified by first parsing all of the source data files into files having all of the instances of a particular component in all of the source files. These parsed files are then analyzed at step 64. This analysis does not have to be fast, because it is done off-line. The results for all components for the Filter are then consolidated at step 66 into a single "Predictor Data" file, which eliminates redundant data among the multiple component models.

CODER FOR INTEGER DATA

The coder for integer data is preferably based on a three level system. The highest level operations are based on models which exploit relationships between a data item and specific previous items in the data block, such as a LZ algorithm, which encodes the distance to a sequence of matching values, or as a difference transform, which transforms a value into the offset from the previous value. The mid-level operations are based on models which are independent of the position of the data values in the source data block. They exploit characteristics of the data such as the frequency at which specific values occur in the overall block or the frequency at which the data values lie in various numerical ranges. They transform the data values into a block of codes. The low level coder compresses these codes based on a probabilistic model. Two well known low-level coders are the Huffman and arithmetic, and either can be used in the current system. The following discussion will only describe the mid and high level systems.

The high-level coder is not a single solution, but rather a collection of methods and models, each of which being effective on a particular type of data set. There is no single solution to this part of the problem, as many other methods could also serve the same general purpose or provide a solution to data sets with different characteristics than those considered here. Some of the methods which will be described are standard techniques, and the others are unique adaptations of standard techniques. In addition to describing these methods, a general framework is described for integrating these high-level models and to show how the data resulting from their transforms is efficiently handled by the mid-level coder.

The mid-level coder has to reduce the size of the alphabet to one which can effectively be handled by the low level coders. Common numerical word sizes often require more symbols than can be handled by conventional implementations of either Huffman or arithmetic codes. For example, over 4,000,000,000 symbols would be required to represent the alphabet of 32-bit integers, which far exceeds the book-keeping capabilities of these coders. The mid-level coder takes advantage of two characteristics which are common in numerical data blocks.

First, specific data values often occur at a high frequency in data blocks. Each data block can have a unique set of these magic values, and these values can occur at any point in the numerical range.

Second, data values may be distributed unequally with respect to the numerical range. For example, in some data blocks, smaller values tend to be more frequent than larger values.

Figure 7:
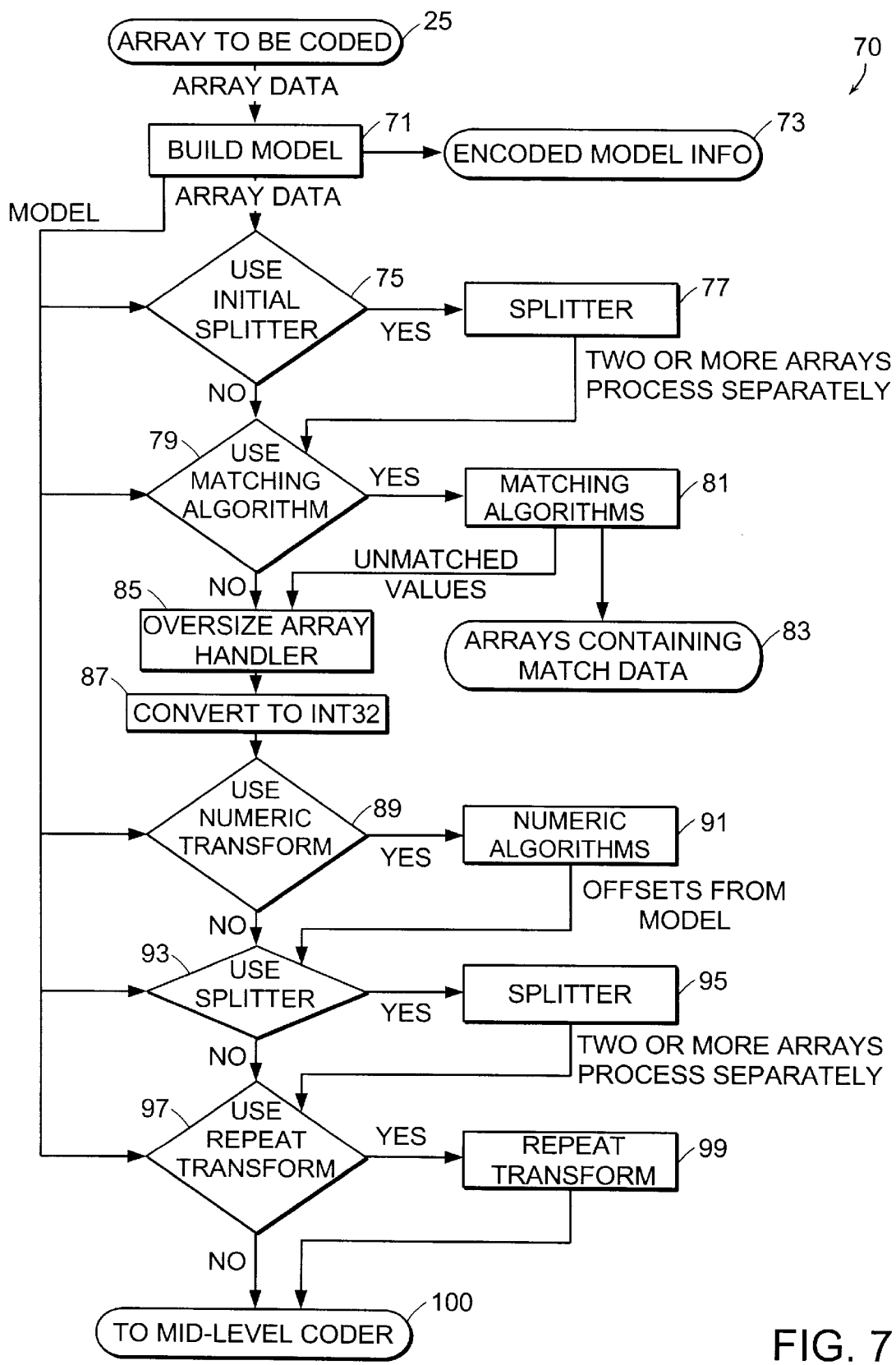
FIG. 7 is a flowchart overviewing the high-level of the integer coder.

FIG. 7 is a flowchart overviewing the high-level of the integer coder. The integer coder 70 begins, at step 71, by constructing the high-level model, which determines which transforms will be used and the other parameters needed to implement those transforms. This data is stored in an encoded module data structure at step 73 and used at various steps during processing, as illustrated.

The first option is an initial splitter at step 75, which is used when the lower bytes in a value are highly correlated independently of the upper bytes. A common example of this is the occurance of zeroes in the lower digits of base 10 values at a frequency much higher than the 10% expected under a random data set. When the high level modeler detects such a condition, it can cause the source array, at step 77, to be split into separate arrays representing the upper and lower digits in the source values. The plurality of Arrays returned by the splitter are processed separately.

Array data is next tested at step 79 to determine if a matching algorithm should be applied to the data. The matching algorithms at step 81 eliminate redundant data items: those which completely match a previous entry in the array. The matching algorithms store Arrays having matched data at step 83. Unmatched values are processed by an oversize array handler at step 85.

The system preferably limits the size of an integer Array to a fixed maximum, which improves efficiency and simplifies some of the design issues. If an Array count exceeds this maximum, the oversize array handler (step 85) breaks the array up into a series of smaller Arrays. These Arrays are then converted, at step 87, to int32s so that the remaining routines can operate on a common data type. These transforms take place after the matching algorithms (step 81), because the matching algorithms work more efficiently on the larger blocks.

The int32 data is next checked at step 89 to determine if a numeric transform is to be done next. At step 91, numeric algorithms transform the array into offsets from a value predicted using previous values. These offsets from the model are then provided to the splitter decision block at step 93.

As before, if a splitter function is needed, a splitter operation is performed at step 95. The splitter function returns a plurality of Arrays, which are processed separately.

At step 97, a determination is made whether to use a repeat transform (step 99). The repeat transform at step 99 is a type of matching transform, but can be used after all the other transforms. In either case, processing flows to the mid-level coder 100.

Note that the splitter is shown in two places (steps 77 and 95) in the flow chart. This is because splitting is typically done before a numeric transform or after a matching transform, when one of these transforms is used. The matching, numeric, and repeat transforms exploit the relationship between a data item and previous data items in the block being encoded.

It should also be noted that the term "high-level" refers to the construction of this coder, but not to the relation between this coder and the overall compression system. Before sending a data block to this coder, the overall system can do many things to enhance compression, such as parsing the source data so as to create arrays of similar components and taking advantage of interrelationships between different components. The operation described here excludes those which should be handled at the system level. This description also assumes that the overall system is screening out data types which are better served by specialized coders, such as bilevel data, text, bit-mapped images, etc.

The purpose of the high-level coder is to exploit relationships between different data items in a data block. Two types of relationships are currently handled: numerical transforms and matching. The numerical transforms predict a data value D[i] as a function of an arithmetic operation performed on previously data values in the block. The D[i] is then represented as an offset from the value predicted by the transform equation. The transform is efficient if the number of bits needed to encode the transformed value are less than that needed to encode the original value. The matching algorithms encode matches between D[i] and a previous value in the data block. The algorithm is efficient if the number of bits needed to encode the position of the matching value is less than that needed to encode [i]. Both types of operations may be performed on the same block. For an example, a difference transform which represents D[i] as the offset from D[i−1], can be followed by a matching algorithm which finds matches of these offsets.

The decision as to which operations to perform on a data block is made by a modeler. Maximum compression can be achieved by encoding the full data block using each possible combination of algorithms, but this requires more processing time than most real-world applications can spare. The evaluation can be speeded up by testing an alternative on only a subset of the data block to be encoded and by building models which estimate the encoding costs of the transformed data blocks without fully encoding them. The coder provides the abilitiy to trade-off processing cycles against compression performance: when the application environment is under less time pressure, it can spend more time evaluating alternatives to improve compression performance. The discussion of each algorithm wil include a description of the model used to estimate the encoding costs if that algorithm is used.

The first step in the high-level coder is to determine the costs of encoding the data block if no transform is used, as the bypass coding tables will later be used to evaluate the effectiveness of the other alternatives. The bypass mode can be tested by creating a sample data block and sending it to the mid-level simulator. The mid-level simulator, to be described below, provides a fast mechanism for estimating the costs of encoding blocks sent to the mid-level coder. The size of the sample data block is adjusted according to time constraints. Because the mid-level coding is independent of the position of data values, the samples can be randomly dispersed in the data block, instead of selecting sample blocks as needed to evaluate a sequential algorithm. When evaluating other high-level modes, the modeler can use the encoding tables generated by the mid-level coder to estimate the cost of encoding each item in the source data block.

The simplest relationship is to encode a value as an offset from a previous value. This essentially predicts that D[i]=D[i−1], and transforms D[i] into the offset from the predicted value:

$$D[i] = D[i] - D[i-1] \tag{1}$$

The system also supports a variation on this which is less susceptable to noise, in that it predicts that a value equals the average value over the N previous entries:

$$D'[i] = D[i] - \frac{1}{N} \times \sum_{j=1}^{j=N} D[i-j] \tag{2}$$

Equation 1 can be viewed as a case of Equation 2 in which N=1. But they are implemented using separate routines to take advantage of the increased speeds when processing the simpler Equation 1.

While some data types (sound, images, etc.) could take advantage of more complex relationships, such data types are preferably encoded using specialized routines, so that no other equation is integrated into the general purpose integer coder.

The modeler is done in two stages. The first stage selects the best numerical model, which in ourcurrent set-up is just the selection of the optimum value of N in Equation 2. It is adequate to check just a few values, such as N=1,2 and 4, and then select the value of N which produces the smallest offsets. The most accurate reflection of coding costs would be to compare the base 2 logarithms of the offsets, but it is adequate just to evaluate the absolute values of the offsets:

$$TmpCost_N = \sum_{i=0}^{i=ct-1} \text{abs}(D'_N[i]) \tag{3}$$

where ct=number of entries in the data block

This routine can quickly find the optimum numeric relationship, so that the more elaborate routine needed to estimate encoding costs only has to be run on one numeric alternative. The current routine to estimate the actual encoding costs is based on encoding a sample data set using the mid-level coder as was done for the bypass assessment.

Three matching algorithms are preferably implemented: a version of the LZ algorithm which has a number of improvements for working with integers; a repeat transform, and a Move-to-Front (MTF) algorithm.

While the basic LZ algorithm does not specify a word size, most implementations are based on using 1-byte words. The preferred system allows a flexible word size, which currently includes 1, 2 and 4 byte integers. The routine generates three output arrays:

Unmatched values: these are the integers in the data block whch are not part of a match sequence. The data type is unchanged—if the source array was int32s, the unmatched values will also be int32s. This compacted array will be sent to the lower levels of the integer coder for compression.

Length: For match sequences, this gives the number of words which were matched in that sequence. Otherwise, this gives the number of unmatched values before the next match.

Position: This gives the offset (number of words, not bytes) to the start of the matching sequence.

Another innovation in the implementation of the algorithm is a dynamic system for evaluating matches. Traditional LZ implementations assume a fixed cost for encoding unmatched data items, but the results of the bypass evaluation are available which give a good estimate of the cost of encoding each different unmatched data value. For example, if the value 1019 occurs at a 25% frequency, its encoding cost as an unmatched item would be 2 bits, which means that it would not be efficient to encode a match of 2 such values as a match sequence, since the cost of encoding the match would exceed the cost of encoding the value as an unmatched entry. The extent to which this system of dynamic evaluation is implemented can be adjusted according to the speed/compression trade-offs in each real-time situation.

The repeat transform replaces repeated values with repeat codes. The preferred system provides a few improvements over standard implementations. First, repeat codes are dynamically adjusted. That is, the repeat codes used for each data block are adjusted according to two characteristics of the data block: the size of the data block and the number of repeated values in the block. Second, special run-to-end code denotes that a repeat sequence continues to the end of the block. Finally, there are also special codes to represent large values. To make room for the repeat codes, unmatched positive values are shifted upward by the number of repeat cods. To avoid increasing our numerical range, the values at the end of the positive range are encoded using special codes.

Traditional MTF coders assume small word sizes, so they can represent all possible symbols as match distances. Large word sizes are allowed for by using a limited size buffer and creating an output array of unmatched values which can be sent to subsequent levels of the integer coder for encoding. If a data value matches a value in this buffer, it is represented using the index of the matching value in the buffer. Otherwise, the number of unmatched values before the next buffer match are recorded. The size of the buffer is adjusted according to the bypass test results. When time allows, the cost of encoding an item as an unmatched value is traded off against the cost of encoding it as a buffer match, but because of the lower overhead, this is not as critical to the MTF algorithm as it was to the LZ.

This MTF algorithm will outperform the integer LZ when individual items match but there are few multi-word match sequences. To avoid redundant searching for matches, both algorithms are preferably integrated into a single transform routine which generates separate output arrays, and then afterward select the one which performed better.

Rather than to evaluate the matching algorithms using small sample sets, the transform can be run on the full data block, and then evaluate the results for sending them to the mid-level simulator. When the application environment is severely time-constrained, this evaluation occurs after only a part of the block has been transformed.

In many real-world data sets, the individual digits of the base 10 representations of the values have characteristics which can be exploited to increase compression. These characteristics are exploited using a technique called "splitting". The array of integers is split into two or more separate arrays of integers, where each array is created from a subset of the digits in the source array. Splitting is efficient when the total encoding cost of the split arrays is less than the cost of encoding the input source array. One example of an array which is efficiently processed using splitting would be:

| Source Array | Array 1: | Array 2: | Array 3: |
| --- | --- | --- | --- |
| 10795484 | 107 | 95 | 484 |
| 11995460 | 119 | 95 | 460 |
| 13195399 | 131 | 95 | 399 |
| 12295501 | 122 | 95 | 501 |
| 11195453 | 111 | 95 | 453 |

| Source Array | Array 1: | Array 2: | Array 3: |
| --- | --- | --- | --- |
| 11895469 | 118 | 95 | 469 |
| ... | ... | ... | ... |

Before the split, the source array appears as randomly varying within a 21 bit range (10795484–13195399). But after the split, the first column can be encoded in 4 bits/entry, the second disappears, and the third falls within a 7 bit range (399–501). The total coding cost is about half the cost of coding the source array. Furthermore, each array can often be split in several ways.

Splitting is useful because it finds correlations which sometimes occur between the digit fields which are not apparent to other methods of evaluating the numbers. It is especially important here, because some of the transforms to be described for the range-remapper will treat lower bits as random numbers. Without the use of splitting, the correlations in the lower digits, such as the presence of many zeros, would be lost:

The high level modeler has to make several decisions concerning splitting. First the modeler determines the best model to use and whether splitting is more efficient than the other coding alternatives. Second, the modeler determines whether a matching algorithm should be run before the splitting is done. Finally, the modeler determines which high-level algorithms should be run on each of the split arrays after splitting, such as a numerical transform or one of the matching algorithms.

The relationships which are amenable to splitting are usually only visible in the base 10 representation, so the first action of the splitter is to convert the data into a base 10 representation. In some cases, the source data may have been originally in alphanumeric representation, and conversion time is saved in such cases by passing the string representation of the data block as an optional argument to the integer coder.

To evaluate the splitter algorithm, a histogram is built for each digit, giving the frequency of occurrence of each of the 10 possible values in that digit field. These histograms are then used to identify and group the digit fields which should be split into separate arrays. The arrays are then checked to see if the repeat transform is efficient, and then the coding costs can be estimated using the mid-level simulator.

Figure 8:
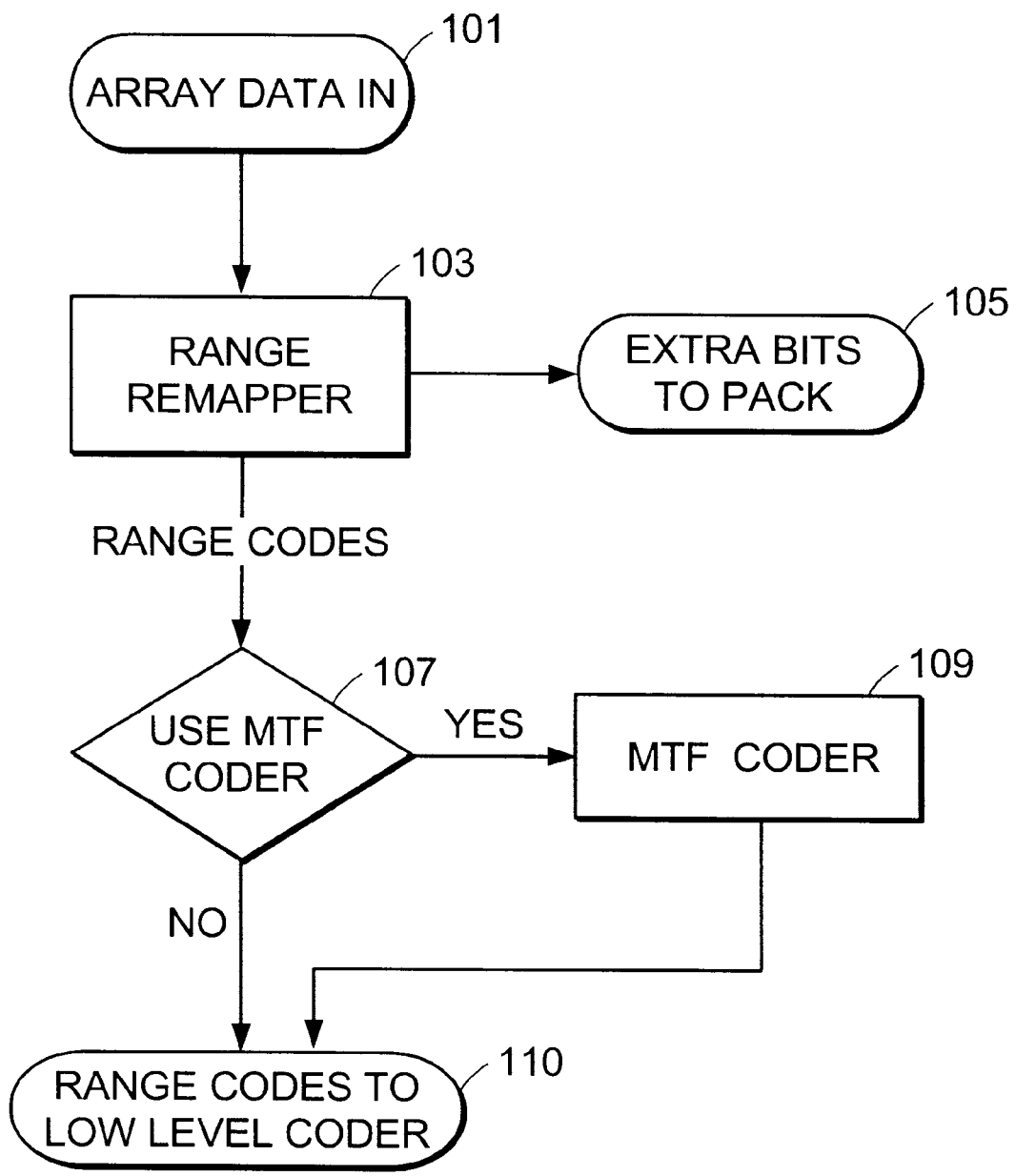
FIG. 8 is a flowchart overviewing the mid-level of the integer coder.

FIG. 8 is a flowchart overviewing the mid-level of the integer coder. Array data is input at step 101 and is first processed by a range mapper at step 103. Extra bits to be packed are stored at step 105. From the resulting range codes a determination is made whether to employ an MTF coder at step 107. If that determination is affirmative, then the MTF coder is executed at step 109. The final range codes are provided to the low-level coder at step 110.

This mid-level coder has to reduce the size of the alphabet to one which can effectively be handled by the low level coders, and to do its function in a way which maximizes compression. It includes a range remapper (step 103) and an optional post-transform MTF (Move to Front) transform (step 109). The range coding may reintroduce a positional component into the data set, in that range codes may tend to match the nearby range codes even when the original values did not match. If this has occurred, the MTF transform is run before sending to the low-level coder, which converts these symbols into the encoded data stream. The output of the mid-level coder is sent to the low-level coder. The mid-level simulator can also be used by higher level routines to estimate coding costs.

The range remapper converts the integer input into code words. Each input value is represented by a single code word. Because the number of code words is usually less than the number of possible data values, some of the code words can represent more than one possible source value. In these cases, the code word indicates a range of values, and the range-remapper bitpacks an offset within this range. This is a standard compression technique.

The standard approaches tend to use pre-defined range tables and allow the low-level coder to use fewer bits for the range codes for the ranges most common in the data block. The preferred system creates range tables which are optimized for each data block, and significantly reduces the number of bits used to pack the offsets within the ranges. For example, a fixed range table might define a range that begins at 0x10000 and ends at 0x20000, which requires 16 bits to pack the offset for each entry in that range. But all of the entries in that range may have the value 0x18000. The preferred system would discover this and create a special range for this value which requires no extra bits.

The system uses the term "magic values" to describe specific values which occur at a high frequency in the data block. These values are given special treatment because they should be packed without using extra bits regardless of where they occur in the data range. For the remaining "non-magic", optimized ranges are created which adapt to the distribution of values within the data block.

The first step is to determine a target table size. Each table entry requires a fixed overhead in both the range remapper and in the low-level coder. Smaller data blocks should use smaller table. But data blocks with a large numerical range may save more bits using better tables, so the size of the table is also to be adjusted for the data range. The target number of entries for each table entry, called the min_freq, is then calculated as:

$$\text{min\_freq} = \text{num\_entries} / \text{target\_tab\_size}; \quad (4)$$

The final table sizes will be substantially different from the targets, but this gives a value to use in the table construction. A sorted histogram giving the frequency of each value in the data block is created next. The table is built in two sections: one for positive values, and one for negative. The general procedure for creating an adaptive range table is described for the positive table:

Start at the smallest value with a freq >0 and call it the "base" of our first range. If its frequency is less than min_freq, expand the range by adding another value to it until the total frequency of values included in the range >min_freq. At this point, the range will have the size $$\text{range\_size} = \text{last\_val} - \text{base}; \quad (5)$$

Get the number of bits nbits needed to express all possible values in the range. Expand the range to the size 1<<nbits. The next range will begin at $$\text{base}[i+1] = \text{base}[i] + (1 << \text{nbits}[i]); \quad (6)$$

Skip over the hist values until get to the next value >=base[i +1], and then create the next range. The negative table is done at the same way, beginning at −1 and moving to larger negative values.

EXAMPLE 10

While this introduces the general approach, it is modified to handle the magic values. Any value whose freq >min_freq is a magic value which should get a separate table entry that requires no extra bits. If one is encountered during the process of building the table, it is added to a special list which will be maintained of the magic values. The data range is compacted so as to remove the magic value from the range:

If min_freq 10:

| Val | Freq | Freq After Removing Magic Val | Base | Offset | Ebits |
|---|---|---|---|---|---|
| 100 | 4 | 4 | 100 | 0 | 2 |
| 101 | 3 | 3 | 100 | 1 | 2 |
| 102 | 12 | 0 | (magic) |  | (0) |
| 103 | 3 | 3 | 100 | 2 | 2 |
| 104 | 2 | 2 | 100 | 3 | 2 |

If the min_freq in this example was 10, and a new range was to be started at value 100, value '102' is a magic value and is deleted from the range whose base is at 100. All four values remaining in that range (100,101,103,104) can then be expressed using a 2 bit offset.

The range tables can be reconstructed using the list of magic values and the ebits (the number of extra bits to encode the offsets) for each range. To encode the ebits a 2 bit code whose values represent offsets from the previous ebits entry is created for each entry:

0: ebits[i]=ebits[i−1]−1
1: ebits[i]=ebits[i−1]
2: ebits[i]=ebits[i−1]+1
3: ebits[i]=ebits[i−1]+offset
where offset is packed as a signed value using a number of extrabits.

Four of these codes are packed into a 1 byte value, and then a low-level coder is used with a pre-defined static table to code the 1 byte code words. A sampling interval is defined, and the extrabits value (the maximum number of bits needed for any offset) are adjusted, for each sample group. Several sets of low-level encoding tables are also created, and the code table is selected according to the amount of activity (total bits changed) in a sample group.

To encode the list of magic values, the list is sorted and converted to offsets from the previous value. These offsets are then encoded using 2-bit codes:

0: offset=1
1: offset=2–5. Pack 2 extra bits to select which
2 offset >=6. Use special coding procedure for oversize offsets
3: repeat previous offset rpt_ct times. 2 bit code used to find the rpt_ct:
 0: rpt_ct=1
 1: rpt_ct=2,3. pack extra bit to select
 2: rpt_ct=4–6. Pack 2 extra bits to select. Code 2 with offset=3 used to indicate special MAX_RPT value
 3: rpt_ct=7–22 pack 4 extra bits to select.

Four of these 2-bit codes are packed into a 1 byte word, and then this word is encoded using a pre-defined static table selected according to the last 2-bit code in the previous word. The oversize offsets are encoded using a statically defined base+offset range table. The range codes are encoded using the low-level encoder with a table selected according to the previous range code. The offsets are bit-packed.

The range codes may sometimes be positionally correlated: similar codes may be clustered near each other. In such cases, running the codes through a standard MTF transform may improve the coding in the low level coder. This is tested for using a sample block of codes prior to sending the codes to the low level coder. The transform is then used of it is efficient.

The high level modeler often needs an estimate of the encoding cost of a block to select among competing high-level algorithms. The simulator receives a block of sample values as well as the size of the full data block. It uses the samples to generate an estimate of the cost of encoding the full data block. When making this estimate, several modifications are made in the operation of the mid-level coder:

Estimate of costs of encoding the tables using a model based on the number of entries and the total number of bits changed for the entire table;

Estimate of costs of encoding the range codes from the frequencies of each code using a fast approximation of the standard equation:

$$cost = -\sum \log_2\left(\frac{freq[i]}{tot\_freq}\right) \quad (7)$$

where: freq[i]=frequency of code[i]
tot_freq=total frequency of all codes
log2=base 2 algorithm
cost=numbits needed to encode the block;

Compute the cost of extra bits needed to code the offsets within the ranges; and Delete the mid-level MTF.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A computerized method of coding data having a plurality of data components, each data component structured into a data field of an associated data type according to an organized file format, comprising:
   from a source data structure of an organized file format, creating a plurality of blocks based on the source data structure, each block associated with a specific respective data field;
   parsing each data component from the source data structure into one of the plurality of blocks based on the data field of the data component;
   for each block:
      selecting a compression algorithm from a plurality of candidate compression algorithms based on the data type of the data field associated with the block;
      applying the selected compression algorithm to compress each data component in the block; and
   combining the compressed data components from the plurality of blocks into an encoded data structure.

2. The method of claim 1 wherein the source data structure is organized in a first format and parsing comprises converting the source data structure into a second format.

3. The method of claim 2 wherein converting comprises collecting similar data from the source data structure into respective blocks.

4. The method of claim 2 wherein converting comprises forming a compression model based on the first format.

5. The method of claim 1 wherein the compression algorithms are further determined based on the amount of data in the respective block.

6. The method of claim 1 wherein a compression algorithm is adapted to the respective block.

7. The method of claim 1 wherein selecting comprises forming a customized transform.

8. The method of claim 1 further comprising recovering the source data structure from the encoded data structure.

9. An article of manufacture, comprising:
   a machine-readable medium;
   a set of instructions recorded in the machine-readable medium to implement a data coding network having a plurality of data components, each data component structured into a data field of a respective data type according to an organized file format, comprising:
      from a source data structure of an organized file format, creating a plurality of blocks based on the source data structure format, each block associated with a specific respective data field;
      parsing each data component from the source data structure into one of the plurality of blocks based on the data field of the data component;
      for each block:
         selecting a compression algorithm from a plurality of candidate compression algorithms based on the data type of the data field associated with the block;
         applying the selected compression algorithm to compress each data component in the block; and
      combining the compressed data components from the plurality of blocks into an encoded data structure.

10. The article of claim 9 wherein the source data structure is organized in a first format and parsing comprises converting the source data structure into a second format.

11. The article of claim 10 wherein converting comprises collecting similar data from the source data structure into respective blocks.

12. The article of claim 10 wherein converting comprises forming a compression model based on the first format.

13. The article of claim 9 wherein the compression algorithms are further determined based on the amount of data in the respective block.

14. The article of claim 9 wherein a compression algorithm is adapted to the respective block.

15. The article of claim 9 wherein selecting comprises forming a customized transform.

16. The article of claim 9 further comprising recovering the source data structure from the encoded data structure.

17. An apparatus to code data having a plurality of data components, each data component structured into a data field of a respective data type according to an organized file format, comprising:
   a plurality of blocks based on and derived from a source data structure of an organized file format, each block associated with a specific respective data field;
   a parser to parse each data component from the source data structure into one of the plurality of blocks based on the data field of the data component;
   a selection system for selecting a compression algorithm for a block from a plurality of candidate compression algorithms based on the data type of the data field associated with the block;
   a coder for applying the selected compression algorithm to compress each data component in the block and for combining the compressed data components from the plurality of blocks into an encoded data structure.

18. The apparatus of claim 17 wherein the parser groups like data from the source data structure into respective blocks.

19. The apparatus of claim 17 wherein the selection system is adaptive to the data in the block.

20. The apparatus of claim 17 further comprising a recovery system for recovering the source data structure from the encoded data structure.

21. The method of claim 1 wherein the organized file format includes defined data types.

22. The method of claim 21 wherein each data type is determined by the type of structure in which the block appears and the position of the block within the structure.

23. The method of claim 7 further comprises transforming a block based on relationships between data components associated with the block.

24. The article of claim 9 wherein the organized file format includes defined data types.

25. The article of claim 24 wherein each data type is determined by the type of structure in which the block appears and the position of the block within the structure.

26. The article of claim 15 further comprises transforming a block based on relationships between data components associated with the block.

27. The apparatus of claim 17 wherein the organized file format includes defined data types.

28. The apparatus of claim 27 wherein each data type is determined by the type of structure in which the block appears and the position of the block within the structure.

29. The apparatus of claim 17 further comprising a transformer to transform a block based on relationships between data components associated with the block.

* * * * *